US006204736B1

(12) United States Patent
Logothetis

(10) Patent No.: US 6,204,736 B1
(45) Date of Patent: Mar. 20, 2001

(54) MICROWAVE MIXER WITH BALUNS HAVING RECTANGULAR COAXIAL TRANSMISSION LINES

(75) Inventor: James J. Logothetis, East Stroudsburg, PA (US)

(73) Assignee: Merrimac Industries, Inc., West Caldwell, NJ (US)

( * ) Notice: Subject to any disclaimer, the term of this patent is extended or adjusted under 35 U.S.C. 154(b) by 0 days.

(21) Appl. No.: 09/200,310

(22) Filed: Nov. 25, 1998

(51) Int. Cl.[7] ................................ H03H 5/00; H04B 1/26
(52) U.S. Cl. ............................................... 333/26; 455/326
(58) Field of Search ................................ 333/26, 246, 25; 455/325, 326, 327

(56) References Cited

U.S. PATENT DOCUMENTS 5,534,830 * 7/1996 Ralph .................................. 333/128
5,745,017 * 4/1998 Ralph .................................. 333/116

OTHER PUBLICATIONS

Gunston, M.A.R., *Microwave Transmission–Line Impedance Data*, Noble Publishing (1996), pp. 23–24, 26, 61.

* cited by examiner

*Primary Examiner*—Robert Pascal
*Assistant Examiner*—Kimberly E Glenn
(74) *Attorney, Agent, or Firm*—Chadbourne & Parke LLP; Drew M. Wintringham; Francis G. Montgomery

(57) ABSTRACT

A double-balanced ring mixer is provided in the form of a microwave integrated circuit that has a homogeneous, multilayer structure. The mixer utilizes baluns comprising rectangular coaxial transmission lines that are capable of operating over a wide range of frequencies while taking up little space. A typical implementation operates at frequencies from approximately 0.9 to 6 GHz, although other frequencies, such as approximately 0.1 to 10 GHz, are achievable.

23 Claims, 8 Drawing Sheets

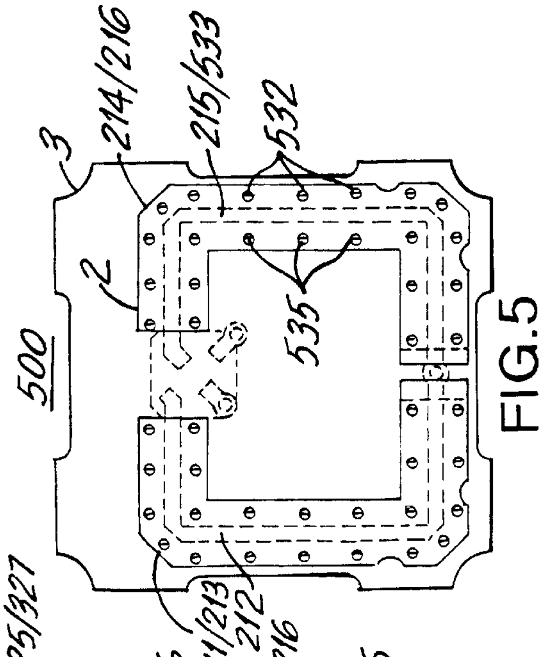
FIG.5
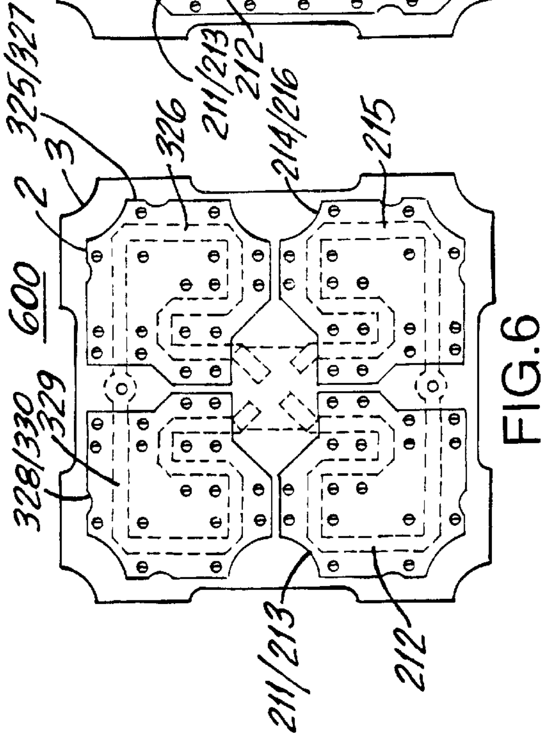
FIG.6
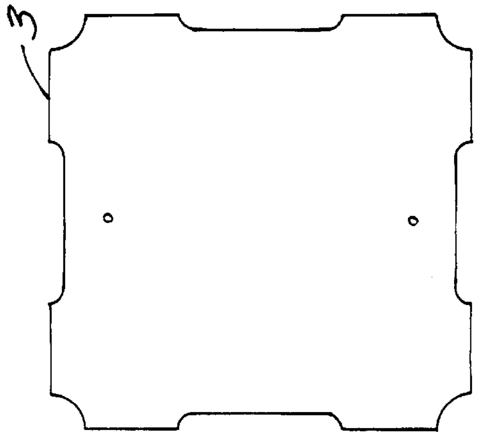
FIG.7b
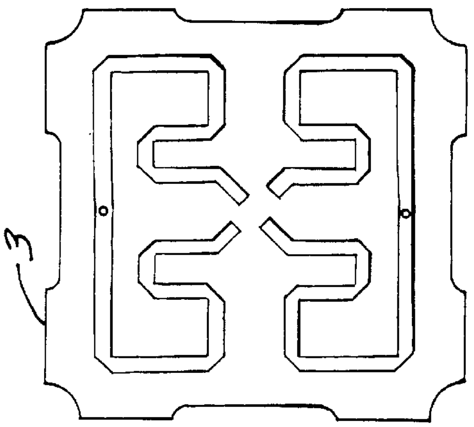
FIG.7a
FIG.7

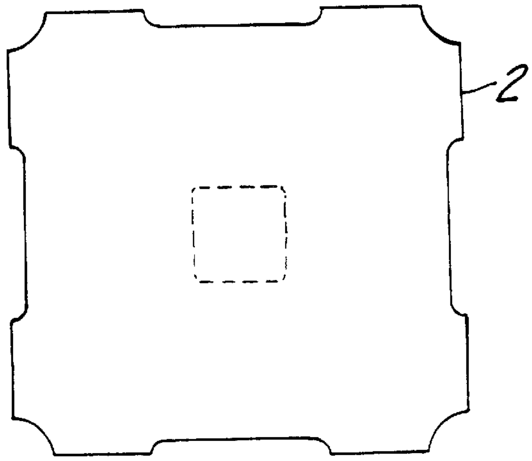
FIG.8
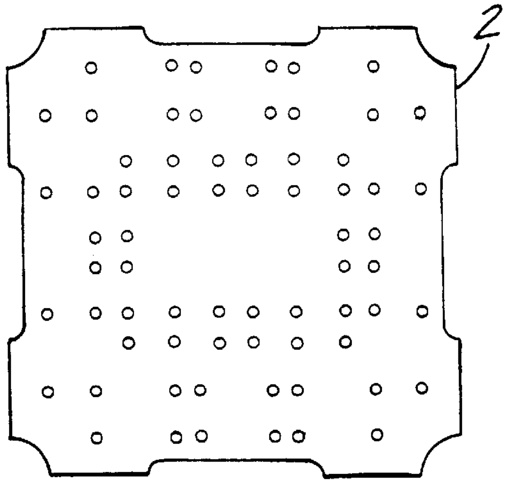
FIG.9a
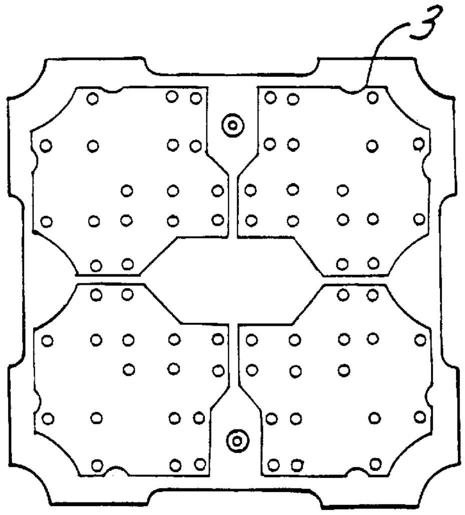
FIG.9b
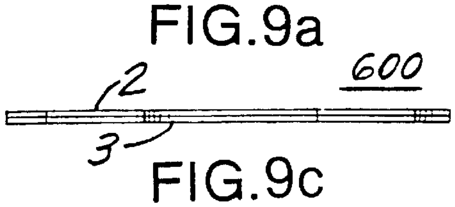
FIG.9c
FIG.9

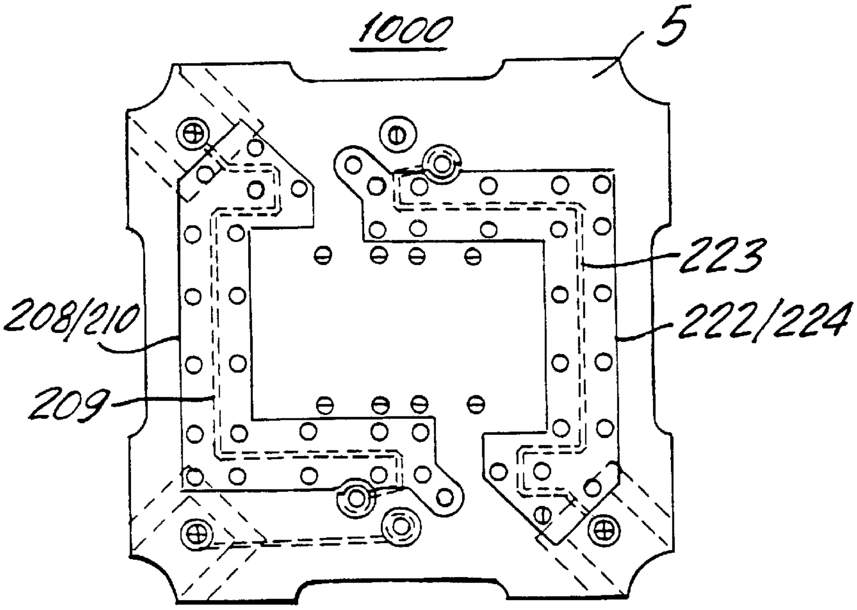
FIG.10
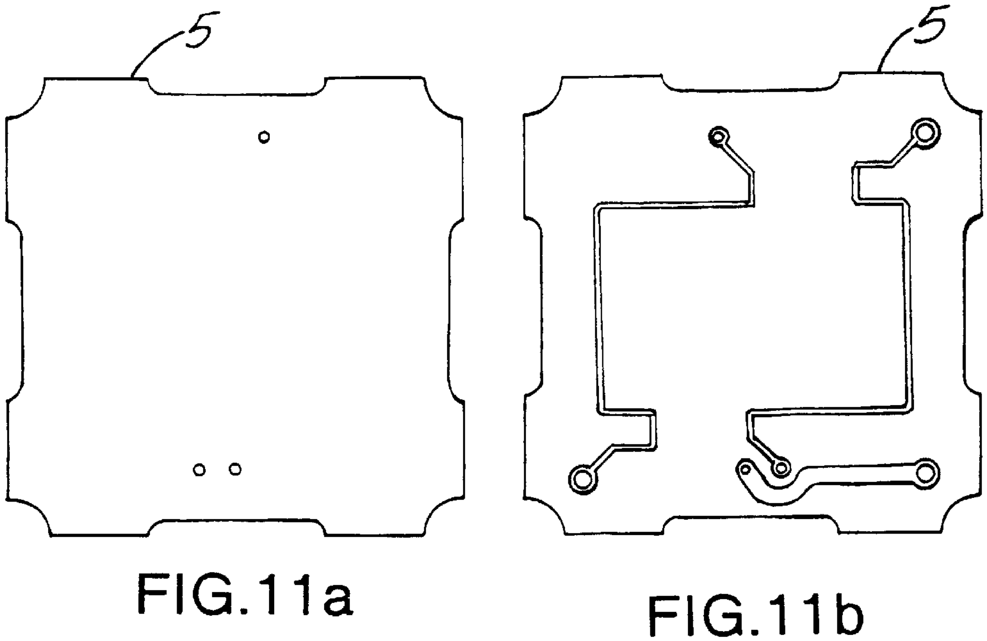
FIG.11a
FIG.11b
FIG.11

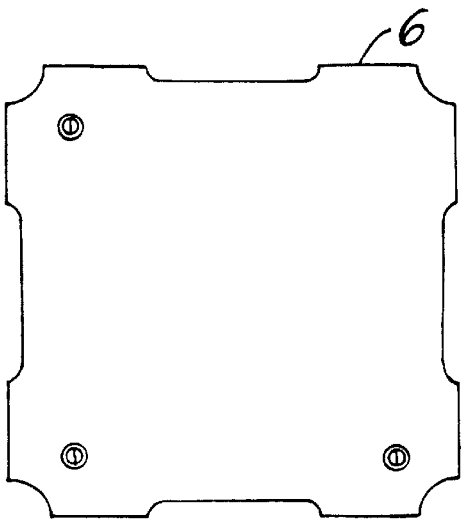
FIG.12a
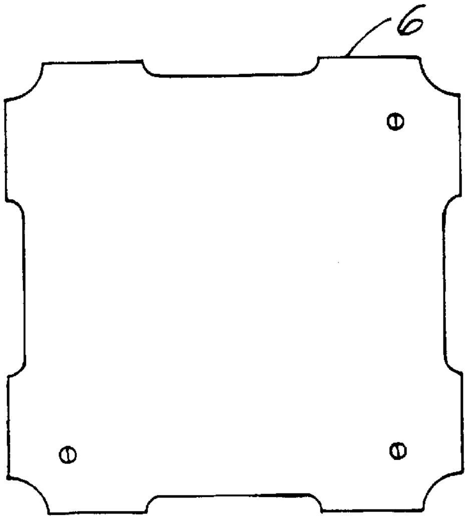
FIG.12b
FIG.12
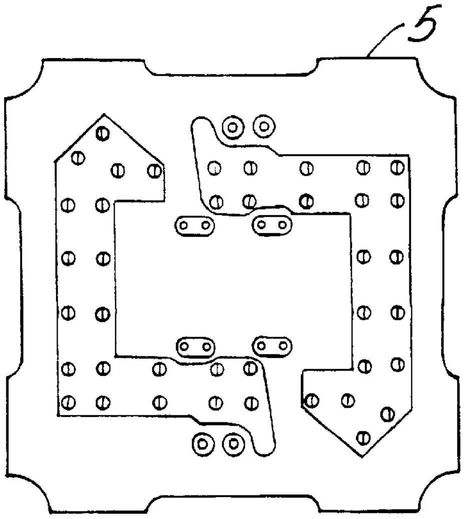
FIG.13a
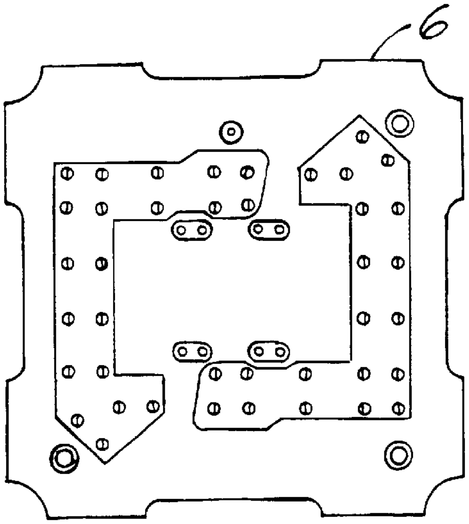
FIG.13b
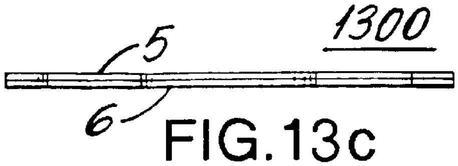
FIG.13c
FIG.13

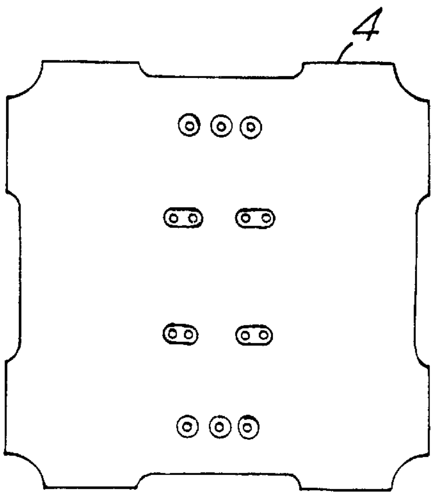
FIG.14a
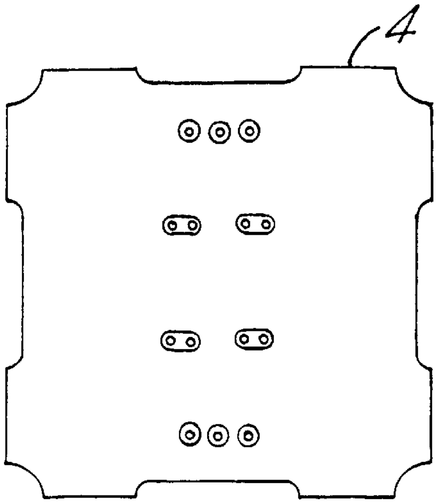
FIG.14b
FIG.14
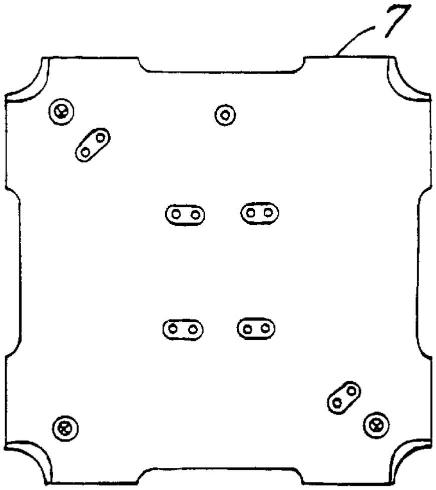
FIG.15a
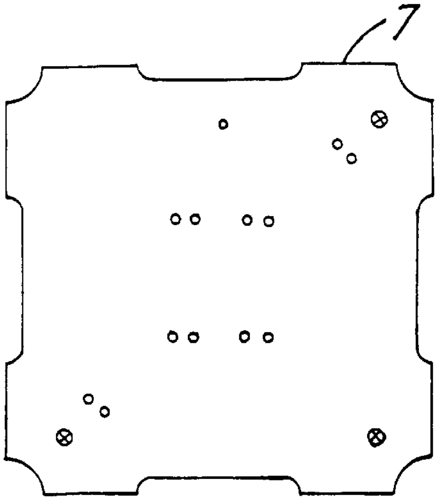
FIG.15b
FIG.15

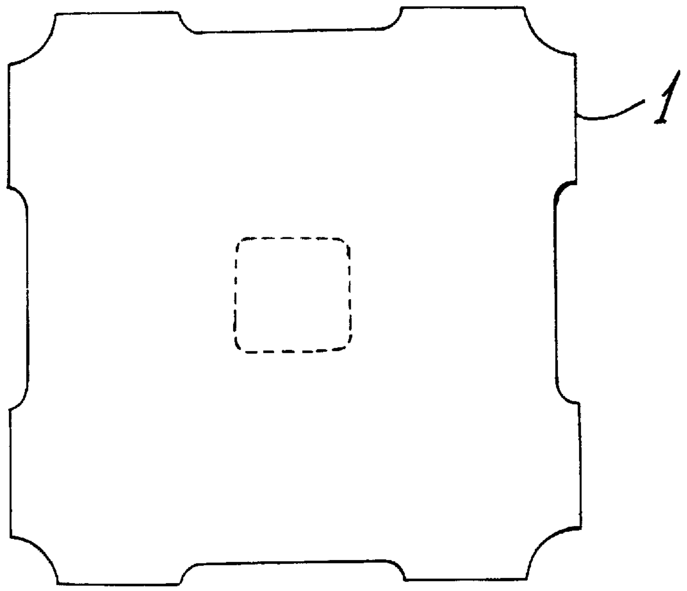
FIG.16
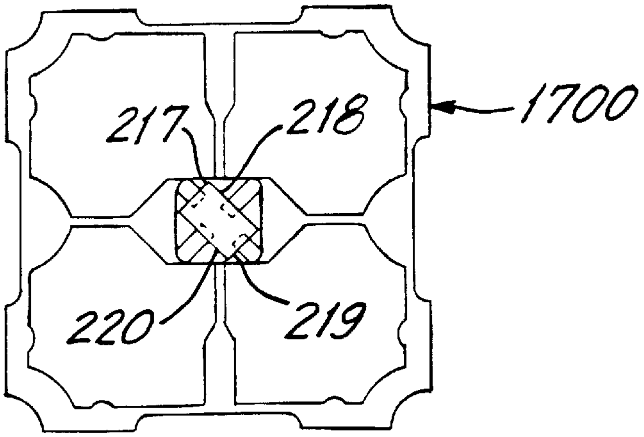
FIG.17a
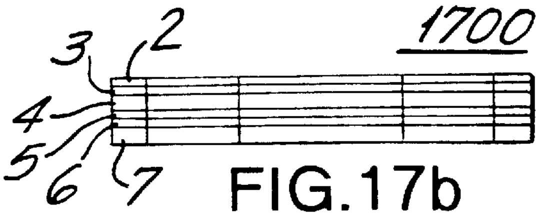
FIG.17b
FIG.17

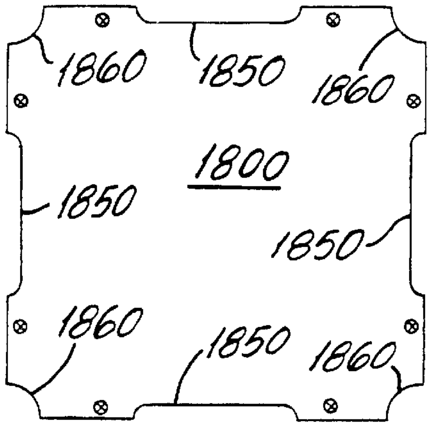
FIG.18a
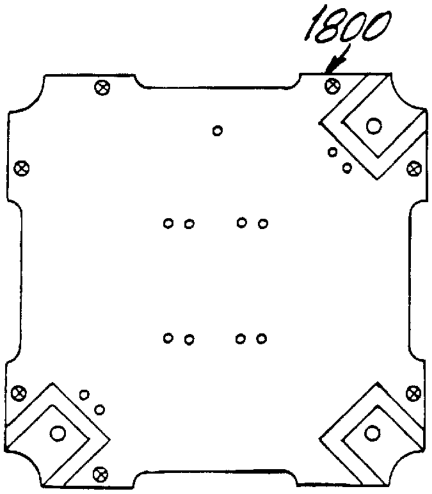
FIG.18b
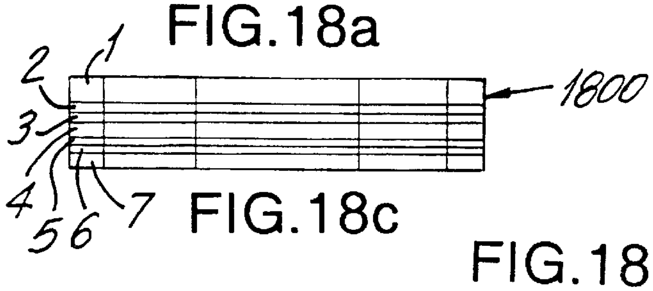
FIG.18c
FIG.18
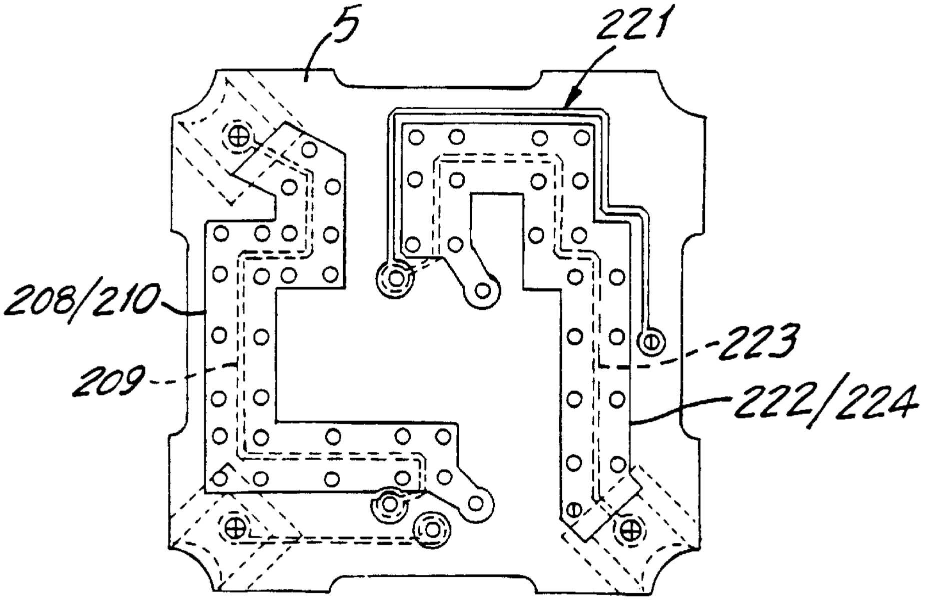
FIG.19

MICROWAVE MIXER WITH BALUNS HAVING RECTANGULAR COAXIAL TRANSMISSION LINES

FIELD OF THE INVENTION

This invention relates to microwave mixers, such as a mixer constructed in a multilayer, microwave integrated circuit, with rectangular coaxial transmission lines. More particularly, this invention discloses a new mixer design, in which baluns composed of rectangular coaxial transmission lines typically operating at 0.9 to 6 GHz are implemented in a multilayer topology, and are utilized to reduce the size, weight, and cost of microwave mixers.

BACKGROUND OF THE INVENTION

Over the decades, wireless communication systems have become more and more technologically advanced, with performance increasing in terms of smaller size, operation at higher frequencies and the accompanying increase in bandwidth, lower power consumption for a given power output, and robustness, among other factors. The trend toward better communication systems puts ever-greater demands on the manufacturers of these systems.

Today, the demands of satellite, military, and other cutting-edge digital communication systems are being met with microwave technology.

Many of these systems use mixers to multiply signals and translate frequency. Mixers are used in both transmitter and receiver applications. Examples of microwave mixers that are built for this purpose are disclosed in Maas, S., *Microwave Mixers,* 2nd Edition, Artech House, 1993.

Microwave mixers may be categorized by the technology used for construction. For example, microwave integrated circuits (MICs) typically include discrete semiconductor components for microwave applications. Monolithic microwave integrated circuits (MMICs) often incorporate semiconductor devices directly on the circuit substrates, also for microwave applications. An alternative type of MMIC includes ceramic substrates with attached beamlead devices. In either case, copper or other appropriate metal is incorporated into the circuitry.

Another class of mixers utilizes Lumped Element Technology. Baluns comprising wire-wound transformers provide relatively broad bandwidths and small size, but have an upper frequency limitation. In addition, Lumped Element Technology is labor-intensive and therefore costly to produce.

Typical MIC mixers are single-layered or double-sided and incorporate Schottky diodes. These mixers are usually passive devices, which do not require DC bias. Such circuits are suspended on metal frames or packaged in housings having pins, leads, or other connectors. MIC mixers perform well at high frequencies and over wide bandwidths. Generally, size increases as frequency decreases.

Thick film MMIC mixers, on the other hand, typically integrate passive Schottky diodes on ceramic substrates. The substrates themselves may form a surface-mount interface requiring no additional packaging for connecting to other electronic components. Thus, thick film MMIC mixers are generally small relative to MIC mixers. However, thick film MMIC mixers usually operate over narrow bandwidths relative to MIC mixers.

Thin film MMIC mixers typically incorporate diodes or field-effect transistors (FETs) directly on silicon or gallium arsenide substrates. Thin film MMIC mixers are smaller than MIC mixers, and are available in die form, but are commonly packaged as surface-mount components. Although such mixers are capable of operating at high frequencies, they usually also operate over narrow bandwidths relative to MIC mixers. Wide bandwidth operation is possible, but development cost is high, with associated design and foundry costs.

In sum, present technologies have several shortcomings that the present invention seeks to overcome. The bandwidth provided by MMIC technology is typically limited, and the development cost is high. Lumped Element Technology has an upper frequency limitation, and is labor-intensive to produce. MIC technology produces circuits that are physically larger, and utilizes metal frames or housings that further increase the size of the packaging.

SUMMARY OF THE INVENTION

The present invention relates to an improved multilayer, microwave mixer which takes advantage of a novel realization of distributed balun technology to gain superior performance benefits over classic MIC and MMIC mixers at reduced size and cost. The balun structure disclosed utilizes rectangular coaxial transmission lines, and operates in range of approximately 0.9 to 6 GHz. Other embodiments of the invention can operate at lower or higher frequencies.

Preferably, the microwave mixer comprises a homogeneous structure having approximately seven substrate layers that are composites of polytetrafluouroethylene, glass, and ceramic. Preferably, the coefficient of thermal expansion (CTE) for the composites are close to that of copper, such as from approximately 7 parts per million per degree C. to approximately 27 parts per million per degree C.

Although these layers may have a wide range of dielectric constants such as from approximately 1 to approximately 100, at present substrates having desirable characteristics are commercially available with typical dielectric constants of approximately 2.9 to approximately 10.2.

Preferably, these layers have a thickness of approximately 0.005 inches to approximately 0.100 inches, and are metalized with copper or other suitable conductor. The copper may be plated, for example, with tin, with a nickel/gold combination or with tin/lead.

Preferably, via holes, which may have various shapes such as circular, slot, and/or elliptical, by way of example, are used to connect the circuitry between layers and form portions of the baluns.

It is an object of this invention to provide a novel balun structure having performance benefits over existing baluns while reducing size and weight.

It is another object of this invention to provide a novel balun structure having performance benefits over existing baluns while reducing manufacturing costs.

It is another object of this invention to provide a balun utilizing substrates that form a compact, surface-mount interface.

It is another object of this invention to provide a balun utilizing substrates that eliminate the need for additional packaging.

It is another object of this invention to provide a balun having an effective bandwidth that is wider than lumped-equivalent baluns used in MMIC mixers.

BRIEF DESCRIPTION OF THE DRAWINGS

Some of the following figures depict circuit patterns, including copper etchings and holes, on substrate layers.

Although certain structures, such as holes, may be enlarged to show clarity, these figures are drawn to be accurate as to the shape and relative placement of the various structures for a preferred embodiment of the invention.

FIG. 5 is a top view of the bonded second and third layers of a seven-layered multilayer microwave mixer having the circuitry shown in FIG. 2.

FIG. 6 is a top view of the bonded second and third layers of a seven-layered multilayer microwave mixer having the circuitry shown in FIG. 3.

FIG. 7*a* is a top view of the unfinished third layer of a seven-layered multilayer microwave mixer having the circuitry shown in FIG. 3.

FIG. 7*b* is a bottom view of the unfinished third layer of a seven-layered multilayer microwave mixer having the circuitry shown in FIG. 3.

FIG. 8 is a top view of the unfinished second layer of a seven-layered multilayer microwave mixer having the circuitry shown in FIG. 3.

FIG. 9*a* is a top view of the unfinished bonded second and third layers of a seven-layered multilayer microwave mixer having the circuitry shown in FIG. 3.

FIG. 9*b* is a bottom view of the unfinished bonded second and third layers of a seven-layered multilayer microwave mixer having the circuitry shown in FIG. 3.

FIG. 9*c* is a side view of the unfinished bonded second and third layers of a seven-layered multilayer microwave mixer having the circuitry shown in FIG. 3.

FIG. 10 is a top view of the bonded fifth, sixth and seventh layers of a seven-layered multilayer microwave mixer having the circuitry shown in FIG. 3.

FIG. 11*a* is a top view of the unfinished fifth layer of a seven-layered multilayer microwave mixer having the circuitry shown in FIG. 3.

FIG. 11*b* is a bottom view of the unfinished fifth layer of a seven-layered multilayer microwave mixer having the circuitry shown in FIG. 3.

FIG. 12*a* is a top view of the unfinished sixth layer of a seven-layered multilayer microwave mixer having the circuitry shown in FIG. 3.

FIG. 12*b* is a bottom view of the unfinished sixth layer of a seven-layered multilayer microwave mixer having the circuitry shown in FIG. 3.

FIG. 13*a* is a top view of the unfinished bonded fifth and sixth layers of a seven-layered multilayer microwave mixer having the circuitry shown in FIG. 3.

FIG. 13*b* is a bottom view of the unfinished bonded fifth and sixth layers of a seven-layered multilayer microwave mixer having the circuitry shown in FIG. 3.

FIG. 13*c* is a side view of the unfinished bonded fifth and sixth layers of a seven-layered multilayer microwave mixer having the circuitry shown in FIG. 3.

FIG. 14*a* is a top view of the fourth layer of a seven-layered multilayer microwave mixer having the circuitry shown in FIG. 3.

FIG. 14*b* is a bottom view of the fourth layer of a seven-layered multilayer microwave mixer having the circuitry shown in FIG. 3.

FIG. 15*a* is a top view of the unfinished seventh layer of a seven-layered multilayer microwave mixer having the circuitry shown in FIG. 3.

FIG. 15*b* is a bottom view of the unfinished seventh layer of a seven-layered multilayer microwave mixer having the circuitry shown in FIG. 3.

FIG. 16 is a top view of the unfinished first layer of a seven-layered multilayer microwave mixer having the circuitry shown in FIG. 3.

FIG. 17*a* is a top view of the placement of diodes in a six-layered subassembly of a seven-layered multilayer microwave mixer having the circuitry shown in FIG. 3.

FIG. 17*b* is a side view of a six-layered subassembly of a seven-layered multilayer microwave mixer having the circuitry shown in FIG. 3.

FIG. 18*a* is a top view of a finished assembly of a seven-layered multilayer microwave mixer having the circuitry shown in FIG. 3.

FIG. 18*b* is a bottom view of a finished assembly of seven-layered multilayer microwave mixer having the circuitry shown in FIG. 3.

FIG. 18*c* is a side view of a finished assembly of a seven-layered multilayer microwave mixer having the circuitry shown in FIG. 3.

FIG. 19 is a top view of the fifth and sixth, and seventh layers of a seven-layered multilayer microwave mixer having the circuitry shown in FIG. 2.

DETAILED DESCRIPTION OF THE INVENTION

I. Introduction

Figure 4:
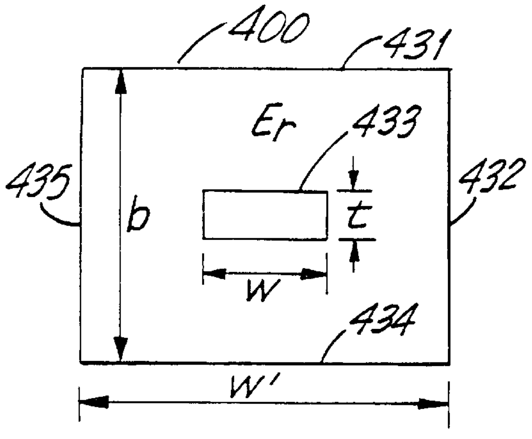
FIG. 4 is a diagram of a cross section of a rectangular coaxial transmission line imbedded within the multilayer mixer structure in FIG. 1.

The microwave mixer described herein comprises a stack of substrate layers. A substrate "layer" is defined as a substrate including circuitry on one or both sides. A layer may have semiconductor devices, for example diodes, amplifiers, transistors, or other devices, embedded within.

The stack of substrate layers are bonded to form a multilayer structure. A multilayer structure may have a few or many layers. Referring to a preferred embodiment having seven layers shown in FIG. 1, substrate layers 1, 2, 3, 4, 5, 6, 7 constitute seven-layered multilayer structure 100. Multilayer structure 100, when manufactured by following the steps outlined below, contains the circuitry for a double-balanced mixer with rectangular baluns. The rectangular baluns, as described herein, provide good performance for a range of frequencies.

II. Multilayered Structure

In a preferred embodiment, a substrate is approximately 0.005 inches to 0.100 inches thick and is a composite of polytetrafluoroethylene (PTFE), glass, and ceramic. It is known to those of ordinary skill in the art of multilayered circuits that PTFE is a preferred material for fusion bonding while glass and ceramic are added to alter the dielectric constant and to add stability. Substitute materials may become commercially available. Thicker substrates are possible, but result in physically larger circuits, which are undesirable in many applications. Preferably, the substrate composite material has a CTE that is close to that of copper, such as from approximately 7 parts per million per degree C. to approximately 27 parts per million per degree C.

Typically, the substrates have a relative dielectric constant ($E_r$) in the range of approximately 2.9 to approximately 10.2. Substrates having other values of $E_r$ may be used, but are not readily commercially available at this time.

Figure 1:
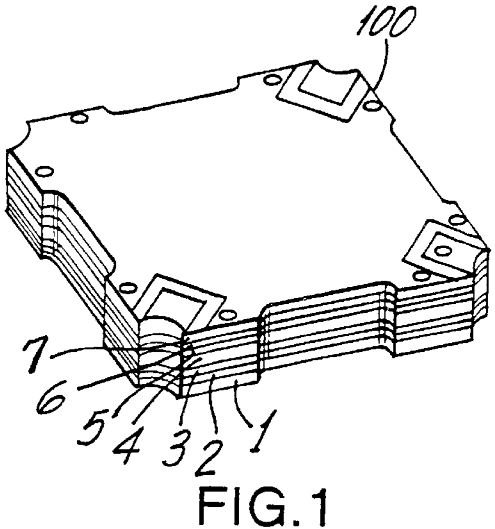
FIG. 1 is a diagram of a preferred embodiment of the invention in which a multilayer mixer has seven layers.

In a preferred embodiment shown in FIG. 1, the substrate of layer 1 has an approximate thickness of 0.030 inches and $E_r$ is approximately 3.0, the substrates of layers 4, 7, have an approximate thickness of 0.020 inches and $E_r$ is approximately 3.0, while the substrates of layers 2, 3, 5, 6 have an approximate thickness of 0.010 inches and $E_r$ is approximately 6.15. Circuits are formed by metalizing substrates with copper, which is typically 0.0002 to 0.0100 inches thick and is preferably approximately 0.0005–0.0025 inches thick, and are connected with via holes, preferably copper-plated, which are typically 0.005 to 0.125 inches in diameter, and preferably approximately 0.008 to 0.019 inches in diameter. Substrate layers are bonded together directly (as described in greater detail in the steps outlines below) using a fusion process having specific temperature and pressure profiles to form multilayer structure 100, containing homogeneous dielectric materials. The fusion bonding process is known to those of ordinary skill in the art of manufacturing multilayered polytetrafluoroethylene ceramics/glass (PTFE composite) circuitry. However, a brief description of an example of the process is described below.

Fusion is accomplished in an autoclave or hydraulic press by first heating substrates past the PTFE melting point. Alignment of layers is secured by a fixture with pins to stabilize flow. During the process, the PTFE resin changes state to a viscous liquid, and adjacent layers fuse under pressure. Although bonding pressure typically varies from approximately 100 PSI to approximately 1000 PSI and bonding temperature typically varies from approximately 350 degrees C. to 450 degrees C., an example of a profile is 200 PSI, with a 40 minute ramp from room temperature to 240 degrees C., a 45 minute ramp to 375 degrees C., a 15 minutes dwell at 375 degrees C., and a 90minute ramp to 35 degrees C.

Figure 2:
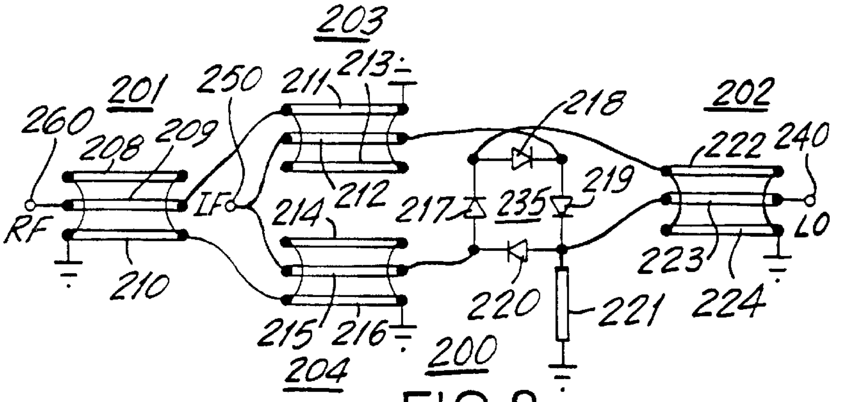
FIG. 2 is a circuit diagram of a preferred embodiment of a multilayer double-balanced microwave mixer.
Figure 3:
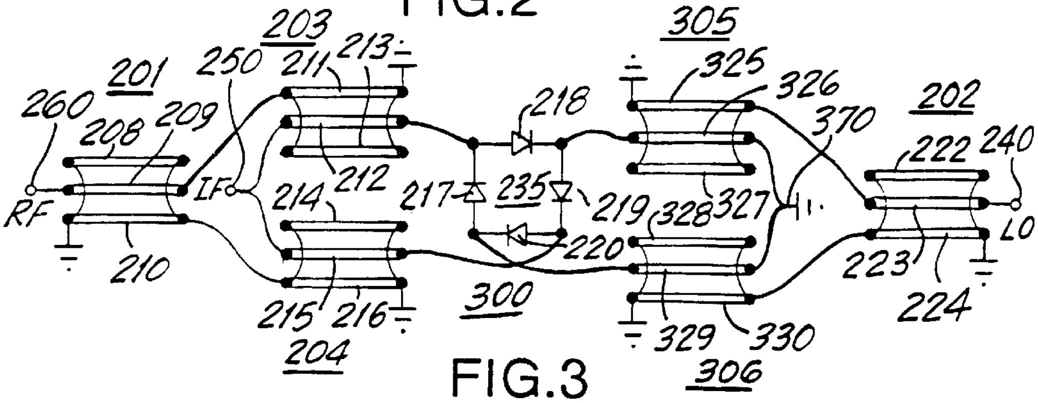
FIG. 3 is a circuit diagram of a preferred embodiment of a fully symmetrical multilayer double-balanced microwave mixer.

Multilayer structure 100 may be used to embody useful microwave mixer circuits, such as circuit 200 shown in FIG. 2 or circuit 300 shown in FIG. 3. Circuit 200 and circuit 300 constitute two preferred embodiments of the invention. However, it is to be appreciated that other circuits may embody the general structure of multilayer structure 100, and that a smaller or larger number of layers may be used. It is also to be appreciated that one of ordinary skill in the art of designing via holes may design via holes of different shapes and/or diameters than those presented here. The following is a description of circuit 200 and circuit 300.

III. Two Embodiments for a Double-Balanced Mixer

Referring to FIG. 2, circuit 200 utilizes transmission lines to form baluns. The impedance of a transmission line can be calculated from its dimensions utilizing Bräckelmann's equation, which is disclosed and discussed in Gunston, M.A.R., *Microwave Transmission-Line Impedance Data,* Noble Publishing (1996). The impedance of transmission lines used in circuit 200 are typically in the range of approximately 25 ohms to approximately 100 ohms. Impedance is selected based upon the desired frequency response of the circuit, in terms of performance and bandwidth.

In a preferred embodiment, rectangular coaxial transmission line 201, which comprises top ground wall 208, center conductor 209, and bottom ground wall 210, has an impedance of 50 ohms, while rectangular coaxial transmission line 202, which comprises top ground wall 222, center conductor 223, and bottom ground wall 234, also has an impedance of 50 ohms. Rectangular coaxial transmission line 203, which comprises top ground wall 211, center conductor 212, and bottom ground wall 213, has an impedance of 25 ohms, while rectangular coaxial transmission line 204, which comprises top ground wall 214, center conductor 215, and bottom ground wall 216, also has an impedance of 25 ohms. The length of transmission lines 201, 202, 203, 204 are preferably designed to be a quarter wavelength at the center frequency of operation for circuit 200. Transmission lines could be designed with other lengths, such as from approximately 0.10 wavelength to approximately 0.6 wavelength, but this would shift the operating bandwidth. For a preferred embodiment, a quarter wavelength is equal to 0.595 inches for a circuit operating at approximately 2.5 GHz and having a bandwidth from approximately 0.9 GHz to approximately 6 GHz.

Transmission line 221, which in a preferred embodiment is a suspended substrate transmission line but in an alternative embodiment may be replaced with another structure with high impedance such as a microstrip, provides a connection to ground. The balun comprising transmission lines 202 and 221 determines the bandwidth of operation for circuit 200, establishes a LO PORT 240 impedance match, transforms the unbalanced LO PORT 240 impedance to the balanced diode impedance at diode ring 235 (formed by Schottky diodes 217, 218, 219, 220), and causes a microwave signal to be split 180 degrees out of phase. The balun comprising transmission lines 201, 203, 204 creates a virtual ground at IF PORT 250, also determines the bandwidth of operation for circuit 200, establishes a RF PORT 260 impedance match, transforms the unbalanced RF PORT 260 impedance to the balanced diode impedance at diode ring 235 and causes a microwave signal to be split 180 degrees out of phase. A more detailed explanation of the operation of circuit 200 may be found in U.S. patent application Ser. No. 09/014,539, filed on Jan. 28, 1998, now U.S. Pat. No. 5,867,072 to Logothetis which are incorporated herein by reference.

With reference to FIG. 3, circuit 300 has many components in common with circuit 200, and the common components have been labeled with the same reference numbers.

In a preferred embodiment, rectangular coaxial transmission line 305, which comprises top ground wall 325, center conductor 326, and bottom ground wall 327, and rectangular coaxial transmission line 306, which comprises top ground wall 328, center conductor 329, and bottom ground wall 330, both have an impedance of 25 ohms and a length of a quarter wavelength.

The balun comprising transmission lines 202, 305, 306 provides virtual ground 370, determines the bandwidth of operation for circuit 300, establishes a LO PORT 240 impedance match, transforms the unbalanced LO PORT 240 impedance to the balanced diode impedance at diode ring 235, and causes a microwave signal to be split 180 degrees out of phase. The balun comprising transmission lines 201, 203, 204 provides the same function in circuit 300 as described for circuit 200.

IV. Operation of a Double-Balanced Mixer

Circuit 200 and circuit 300 are double-balanced ring mixers that utilize Schottky diodes to multiply signals. The creation of sum and difference frequencies is in accordance with the mathematics of double-balanced ring mixers, which is well known to those skilled in the art. The following is a functional description of a preferred application of circuit 200 and circuit 300.

A first microwave signal is injected at RF PORT 260 and travels the length of the balun formed by transmission lines 201, 203, 204 to diode ring 235. A second microwave signal having at least approximately 10 dB greater power than the first microwave signal is injected at LO PORT 240 and travels the length of the balun formed by transmission lines 201 and 211 in circuit 200 (or the balun formed by transmission lines 202, 305, 306 in circuit 300) to diode ring 235. For proper operation, the second microwave signal has a power level that allows diode ring 235 to connect the first microwave signal to IF port 250, thereby causing the phase of the first microwave signal to be switched 180 degrees for half of every cycle of the second microwave signal.

Using circuit 300 as an illustration, during each first half cycle of a microwave signal at LO PORT 240, diodes 217 and 218 are turned off while diodes 219 and 220 are turned on. During each second half of the microwave signal, diodes 217 and 218 are turned on while diodes 219 and 220 are turned off. The resulting switching action commutates center conductors 212 and 215 to ground through center conductors 326 and 329, flipping the phase of a microwave signal at RF PORT 260 by 180 degrees and effectively multiplying the microwave signal at RF PORT 260 by a square wave having a frequency of the microwave signal at LO PORT 240. The result is sum and difference frequencies.

Circuit 200 and circuit 300 have the feature of inherent isolation between RF PORT 260 and the signal at LO PORT 240. Although diodes 217, 218, 219, and 220 have complex impedances, the impedance is constant for each discrete frequency, causing diode ring 235 to function as a balanced bridge. The signal at RF PORT 260 is similarly isolated from LO PORT 240.

V. Rectangular Coaxial Transmission Line

A cross section of a preferred embodiment of a rectangular transmission line is illustrated in FIG. 4. Rectangular coaxial transmission line 400 is created by the process of etching copper lines of the appropriate width on appropriate layers and drilling via holes, and subsequently bonding the layers together and plating the via holes (in an alternative preferred embodiment, the via holes are plated before, rather than after, the layers are bonded together). Horizontal walls 431 and 434 of rectangular coaxial transmission line 400 are formed by copper lines etched on opposite sides of two layers. Center conductor 433 of rectangular coaxial transmission line 400 is formed by etching copper lines on the side of one of the layers that faces the other layer. Vertical walls 432 and 435 of rectangular coaxial transmission line 400 are formed by plated-through via holes spaced up to approximately 0.060 inches apart.

For example, referring to FIG. 5, twenty six exterior via holes 532 extending through layers 2 and 3 form vertical wall 432. Eighteen interior via holes 535 extending through layers 2 and 3 form vertical wall 435. Horizontal wall 431 is etched on the top side of layer 2, horizontal wall 434 is etched on the bottom side of layer 3, and middle 433, denoted by copper line 533, is etched on the top side of layer 3.

VI. Description of the Manufacturing Process For Second Preferred Embodiment

Although two preferred embodiments have been presented via circuit 200 and circuit 300, the manufacturing process is similar for the two circuits. The following is a step-by-step description of the process used to manufacture multilayer structure 100 incorporating circuit 300. It is to be appreciated that the numbers used (by way of example only, dimensions, temperatures, time) are approximations and may be varied, and it is obvious to one of ordinary skill in the art that certain steps may be performed in different order. A process for constructing such a multilayer structure is disclosed by U.S. Provisional Patent Application Ser. No. 60/074,571, entitled "Method of Making Microwave, Multifunction Modules Using Fluoropolymer Composite Substrates", filed Feb. 13, 1998, and U.S. patent application Ser. No. 09/199,675 of the same title, filed Nov. 25, 1998, both incorporated herein by reference.

It is also to be appreciated that the figures show the outline of layers as they appear after completion of all the steps applied. Thus, some of the figures show corner holes and slots in the edges of the layers that do not exist until all the layers are bonded together and slots 1850 are milled and corner holes 1860 are drilled in assembly 1800 as shown in FIG. 18.

Additionally, it is also to be appreciated that typically hundreds of circuits are manufactured at one time in an array on a substrate panel. Thus, a typical mask may have an array of the same pattern.

a. Subassembly 600

With reference to FIGS. 6, 7, 8, and 9, subassembly 600 is manufactured by applying the following process. First, two holes having diameters of approximately 0.010 inches are drilled into layer 3 as shown in FIGS. 7*a* and 7*b*. Next, layer 3 is sodium etched. The procedure used in sodium-etching a PTFE-based substrate to be plated with copper is well known to those with ordinary skill in the art of plating PTFE substrates. Next, layer 3 is cleaned by rinsing in alcohol for 15 to 30 minutes, then preferably rinsing in water, preferably deionized, having a temperature of 70 to 125 degrees F. for at least 15 minutes. Layer 3 is then vacuum baked for approximately 30 minutes to 2 hours at approximately 90 to 180 degrees C., but preferably for one hour at 149 degrees C. Layer 3 is plated with copper, preferably first using an electroless method followed by an electrolytic method, to a thickness of approximately 0.0005 to 0.001 inches. Layer 3 is preferably rinsed in water, preferably deionized, for at least 1 minute. Layer 3 is heated to a temperature of approximately 90 to 125 degrees C. for approximately 5 to 30 minutes, but preferably 90 degrees C. for 5 minutes, and then laminated with photoresist. A mask is used and the photoresist is developed using the proper exposure settings to create the pattern shown in FIG. 7*a*. The top side of layer 3 is copper etched. The procedure used in copper etching involves applying a strong alkaline or acid to remove copper and is well known to those with ordinary skill in the art of circuit etching. Layer 3 is cleaned by rinsing in alcohol for 15 to 30 minutes, then preferably rinsing in water, preferably deionized, having a temperature of 70 to 125 degrees F. for at least 15 minutes. Layer 3 is then vacuum baked for approximately 30 minutes to 2 hours at approximately 90 to 180 degrees C., but preferably for one hour at 149 degrees C.

Layer 2 is spotfaced (also sometimes referred to as "counterbored") as shown in FIG. 8, to a depth of approximately 0.005 to 0.008 inches deep without breaking through the substrate. Layer 2 is copper etched on the spotface side to remove copper. Layer 2 is cleaned by rinsing in alcohol for 15 to 30 minutes, then preferably rinsing in water, preferably deionized, having a temperature of 70 to 125 degrees F. for at least 15 minutes. Layer 2 is then vacuum baked for approximately 30 minutes to 2 hours at approximately 90 to 180 degrees C., but preferably for one hour at 149 degrees C.

After layers 2, 3 have been processed using the above procedure, they are fusion bonded together with the copper clad sides facing away from each other, as shown in FIG. 9. Next, sixty-eight holes having diameters of approximately 0.015 inches are drilled into bonded layers 2, 3 as shown in FIG. 9*b*. Bonded layers 2, 3 are sodium etched. Bonded layers 2, 3 are cleaned by rinsing in alcohol for 15 to 30 minutes, then preferably rinsing in water, preferably deionized, having a temperature of 70 to 125 degrees F. for at least 15 minutes. Bonded layers 2, 3 are then vacuum baked for approximately 30 minutes to 2 hours at approximately 90 to 180 degrees C., but preferably for one hour at 149 degrees C. Bonded layers 2, 3 are plated with copper, preferably first using an electroless method followed by an electrolytic method, to a thickness of approximately 0.0005 to 0.001 inches. Bonded layers 2, 3 are preferably rinsed in water, preferably deionized, for at least 1 minute. Bonded layers 2, 3 are heated to a temperature of approximately 90 to 125 degrees C. for approximately 5 to 30 minutes, but preferably 90 degrees C. for 5 minutes, and then laminated with photoresist. Masks are used and the photoresist is developed using the proper exposure settings to create the pattern shown in FIG. 9*b*. The bottom side of bonded layer 3 is copper etched. Bonded layers 2, 3 are cleaned by rinsing in alcohol for 15 to 30 minutes, then preferably rinsing in water, preferably deionized, having a temperature of 70 to 125 degrees F. for at least 15 minutes. Bonded layers 2, 3 are then vacuum baked for approximately 30 minutes to 2 hours at approximately 90 to 180 degrees C., but preferably for one hour at 149 degrees C., resulting in subassembly 600 shown in FIGS. 6 and 9.

b. Subassembly 1300

With reference to FIGS. 11, 12, and 13, subassembly 1300 is manufactured by applying the following process.

First, three holes having diameters of approximately 0.010 inches are drilled into layer 5 as shown in FIG. 11*a*. Layer 5 is sodium etched. Layer 5 is cleaned by rinsing in alcohol for 15 to 30 minutes, then preferably rinsing in water, preferably deionized, having a temperature of 70 to 125 degrees F. for at least 15 minutes. Layer 5 is then vacuum baked for approximately 30 minutes to 2 hours at approximately 90 to 180 degrees C., but preferably for one hour at 149 degrees C. Layer 5 is plated with copper, preferably first using an electroless method followed by an electrolytic method, to a thickness of approximately 0.0005 to 0.001 inches. Layer 5 is preferably rinsed in water, preferably deionized, for at least 1 minute. Layer 5 is heated to a temperature of approximately 90 to 125 degrees C. for approximately 5 to 30 minutes, but preferably 90 degrees C. for 5 minutes, and then laminated with photoresist. A mask is used and the photoresist is developed using the proper exposure settings to create the pattern shown in FIG. 11*b*. The bottom side of layer 5 is copper etched. Layer 5 is cleaned by rinsing in alcohol for 15 to 30 minutes, then preferably rinsing in water, preferably deionized, having a temperature of 70 to 125 degrees F. for at least 15 minutes. Layer 5 is then vacuum baked for approximately 30 minutes to 2 hours at approximately 90 to 180 degrees C., but preferably for one hour at 149 degrees C.

Three holes having diameters of approximately 0.019 inches are drilled in layer 6 as shown in FIG. 12*a*. Layer 6 is sodium etched. Layer 6 is cleaned by rinsing in alcohol for 15 to 30 minutes, then preferably rinsing in water, preferably deionized, having a temperature of 70 to 125 degrees F. for 15 to 30 minutes. Layer 6 is then vacuum baked for approximately 30 minutes to 2 hours at approximately 90 to 180 degrees C., but preferably one hour at 149 degrees C. Layer 6 is plated with copper, preferably first using an electroless method followed by an electrolytic method, to a thickness of approximately 0.0005 to 0.001 inches. Layer 6 is preferably rinsed in water, preferably deionized, for at least 1 minute. Layer 6 is heated to a temperature of approximately 90 to 125 degrees C. for approximately 5 to 30 minutes, but preferably 90 degrees C. for 5 minutes, and then laminated with photoresist. A mask is used and the photoresist is developed using the proper exposure settings to create the pattern shown in FIG. 12*a*. The top side of layer 6 is copper etched. Layer 6 is cleaned by rinsing in alcohol for 15 to 30 minutes, then preferably rinsing in water, preferably deionized, having a temperature of 70 to 125 degrees F. for at least 15 minutes. Layer 6 is then vacuum baked for approximately 30 minutes to 2 hours at approximately 90 to 180 degrees C., but preferably for one hour at 149 degrees C.

After layers 5, 6 have been processed using the above procedure, they are fusion bonded together with the copper clad sides facing away from each other, as shown in FIG. 13. Next, forty holes having a diameter of approximately 0.015 inches, and nine holes having a diameter of approximately 0.010 inches are drilled into bonded layers 5, 6 as shown in FIGS. 13*a*, 13*b*. Bonded layers 5, 6 are sodium etched. Bonded layers 5, 6 are cleaned by rinsing in alcohol for 15 to 30 minutes, then preferably rinsing in water, preferably deionized, having a temperature of 70 to 125 degrees F. for at least 15 minutes. Bonded layers 5, 6 are then vacuum baked for approximately 30 minutes to 2 hours at approximately 90 to 180 degrees C., but preferably for one hour at 149 degrees C. Bonded layers 5, 6 are plated with copper, preferably first using an electroless method followed by an electrolytic method, to a thickness of approximately 0.0005 to 0.001 inches. Bonded layers 5 and 6 are preferably rinsed in water, preferably deionized, for at least 1 minute. Bonded layers 5, 6 are heated to a temperature of approximately 90 to 125 degrees C. for approximately 5 to 30 minutes, but preferably 90 degrees C. for 5 minutes, and then laminated with photoresist. Masks are used and the photoresist is developed using the proper exposure settings to create the patterns shown on bonded layers 5, 6 in FIGS. 13*a* and 13*b*. The top side of bonded layer 5 and the bottom side of bonded layer 6 are copper etched. Bonded layers 5, 6 are cleaned by rinsing in alcohol for 15 to 30 minutes, then preferably rinsing in water, preferably deionized, having a temperature of 70 to 125 degrees F. for at least 15 minutes. Bonded layers 5, 6 are then vacuum baked for approximately 30 minutes to 2 hours at approximately 90 to 180 degrees C., but preferably for one hour at 149 degrees C., resulting in subassembly 1300 shown in FIG. 13.

c. Layer 4

With reference to FIG. 14, the process for manufacturing layer 4 is described. First, fourteen holes having diameters of approximately 0.010 inches are drilled into layer 4 as shown in FIG. 14*a*. Layer 4 is sodium etched. Layer 4 is cleaned by rinsing in alcohol for 15 to 30 minutes, then preferably rinsing in water, preferably deionized, having a temperature of 70 to 125 degrees F. for at least 15 minutes. Layer 4 is then vacuum baked for approximately 30 minutes to 2 hours at approximately 90 to 180 degrees C., but preferably for one hour at 149 degrees C. Layer 4 is plated with copper, preferably first using an electroless method followed by an electrolytic method, to a thickness of approximately 0.0005 to 0.001 inches. Layer 4 is rinsed in water, preferably deionized, for at least 1 minute. Layer 4 is heated to a temperature of approximately 90 to 125 degrees C. for approximately 5 to 30 minutes, but preferably 90 degrees C. for 5 minutes, and then laminated with photoresist. Masks are used and the photoresist is developed using the proper exposure settings to create the patterns shown in FIGS. 14*a* and 14*b*. Both sides of layer 4 are copper etched. Layer 4 is cleaned by rinsing in alcohol for 15 to 30 minutes, then preferably rinsing in water, preferably deionized, having a temperature of 70 to 125 degrees F. for at least 15 minutes. Layer 4 is then vacuum baked for approximately 30 minutes to 2 hours at approximately 90 to 180 degrees C., but preferably for one hour at 149 degrees C.

d. Layer 7

With reference to FIG. 15, the process for manufacturing layer 7 is described. First, three holes having diameters of approximately 0.019 inches, thirteen holes having diameters of approximately 0.010 inches, and four edge (corner) holes having diameters of 0.043 inches are drilled into layer 7 as shown in FIG. 15*a*. Layer 7 is sodium etched. Layer 7 is cleaned by rinsing in alcohol for 15 to 30 minutes, then rinsing in water, preferably deionized, having a temperature of 70 to 125 degrees F. for at least 15 minutes. Layer 7 is then vacuum baked for approximately 30 minutes to 2 hours at approximately 90 to 180 degrees C., but preferably for one hour at 149 degrees C. Layer 7 is plated with copper, preferably first using an electroless method followed by an electrolytic method, to a thickness of approximately 0.0005 to 0.001 inches. Layer 7 is preferably rinsed in water, preferably deionized, for at least 1 minute. Layer 7 is heated to a temperature of approximately 90 to 125 degrees C. for approximately 5 to 30 minutes, but preferably 90 degrees C. for 5 minutes, and then laminated with photoresist. A mask is used and the photoresist is developed using the proper exposure settings to create the pattern shown on layer 7 in FIG. 15*a*. The top side of layer 7 is copper etched. Layer 7 is cleaned by rinsing in alcohol for 15 to 30 minutes, then rinsing in water, preferably deionized, having a temperature of 70 to 125 degrees F. for at least 15 minutes. Layer 7 is then vacuum baked for approximately 30 minutes to 2 hours at approximately 90 to 180 degrees C., but preferably for one hour at 149 degrees C.

e. Layer 1

With reference to FIG. 16, the process for manufacturing layer 1 is described. Layer 1 is spotfaced as shown in FIG. 16, to a depth of approximately 0.015 to 0.025 inches deep without breaking through the substrate. Layer 1 is copper etched on the spotface side to remove copper. Layer 1 is cleaned by rinsing in alcohol for 15 to 30 minutes, then preferably rinsing in water, preferably deionized, having a temperature of 70 to 125 degrees F. for at least 15 minutes. Layer 1 is then vacuum baked for approximately 30 minutes to 2 hours at approximately 90 to 180 degrees C., but preferably for one hour at 149 degrees C.

f. Subassembly 1700

With reference to FIG. 17, after layers 4, 7 and subassemblies 600, 1300 have been manufactured, they are fusion bonded to form subassembly 1700. Subassembly 1700 is heated to a temperature of approximately 90 to 125 degrees C. for approximately 5 to 30 minutes, but preferably 90 degrees C. for 5 minutes, and then laminated with photoresist. A mask is used and the photoresist is developed using the proper exposure settings to create the pattern shown on subassembly 1700 in FIG. 17*a*. The top side of subassembly 1700 is copper etched. Subassembly 1700 is cleaned by rinsing in alcohol for 15 to 30 minutes, then preferably rinsing in water, preferably deionized, having a temperature of 70 to 125 degrees F. for at least 15 minutes. The spotface plug resulting from the spotfacing of layer 2 is removed by machining. Diodes 217, 218, 219, 220 are installed in assembly 1700 as shown in FIG. 17*a*, using solder paste, preferably $Sn_{96}AgO_4$ solder paste or alternatively another type of solder paste, such as $Sn_{63}Pb_{37}$ solder paste. In an alternative embodiment, diodes 217, 218, 219, 220 are installed by welding or utilizing conductive epoxy. Subassembly 1700 is again cleaned by rinsing in alcohol for 15 to 30 minutes, then preferably rinsing in water, preferably deionized, having a temperature of 70 to 125 degrees F. for at least 15 minutes. Subassembly 1700 is then vacuum baked for approximately 30 minutes to 2 hours at approximately 90 to 180 degrees C., but preferably for one hour at 149 degrees C.

g. Assembly 1800

With reference to FIG. 18, assembly 1800 is manufactured by applying the following process.

Subassembly 1700 and layer 1 are bonded together, using a bonding film, to form assembly 1800, as shown in FIG. 18. In a preferred embodiment, the bonding film is a thermoplastic polymer bonding film approximately 0.0015 inches thick that is cured according to the profile of 200 PSI, with a 30 to 60-minute ramp from room temperature to 150 degrees C., a 50-minute dwell at approximately 150 degrees C., and a 10 to 60-minute ramp to room temperature. In alternative embodiments, other types of bonding film may be used, and the manufacturer's specifications for bonding are typically followed. Eight holes having diameters of approximately 0.019 inches are drilled, and four slots 1850 are milled in assembly 1800 as shown in FIG. 18 (four corner holes 1860 are not yet drilled). Assembly 1800 is sodium etched. Assembly 1800 is cleaned by rinsing in alcohol for 15 to 30 minutes, then preferably rinsing in water, preferably deionized, having a temperature of 70 to 125 degrees F. for at least 15 minutes. Assembly 1800 is then vacuum baked for approximately 45 to 90 minutes at approximately 90 to 125 degrees C., but preferably for one hour at 100 degrees C. Assembly 1800 is plated with copper, preferably first using an electroless method followed by an electrolytic method, to a thickness of approximately 0.0005 to 0.001 inches. Assembly 1800 is rinsed in water, preferably deionized, for at least 1 minute. Assembly 1800 is heated to a temperature of approximately 90 to 125 degrees C. for approximately 5 to 30 minutes, but preferably 90 degrees C. for 5 minutes, and then laminated with photoresist. A mask is used and the photoresist is developed using the proper exposure settings to create the pattern shown (where layer 7 is exposed) in FIG. 18*b*. The bottom side of assembly 1800 is copper etched. Assembly 1800 is cleaned by rinsing in alcohol for 15 to 30 minutes, then preferably rinsing in water, preferably deionized, having a temperature of 70 to 125 degrees F. for at least 15 minutes. Assembly 1800 is plated with tin or lead, then the tin/lead plating is heated to the melting point to allow excess plating to reflow into a solder alloy. Assembly 1800 is cleaned by rinsing in alcohol for 15 to 30 minutes, then preferably rinsing in water, preferably deionized, having a temperature of 70 to 125 degrees F. for at least 15 minutes.

Four corner holes 1860 having diameters of approximately 0.078 inches are drilled in assembly 1800. Assembly 1800 is de-paneled using a depaneling method, which may include drilling and milling, diamond saw, and/or EXCIMER laser. Assembly 1800 is cleaned by rinsing in alcohol for 15 to 30 minutes, then preferably rinsing in water, preferably deionized, having a temperature of 70 to 125 degrees F. for at least 15 minutes. Assembly 1800 is then vacuum baked for approximately 45 to 90 minutes at approximately 90 to 125 degrees C., but preferably for one hour at 90 degrees C.

VII. Other Embodiments

It is to be appreciated that one of average skill in the art may manufacture circuit 200, based upon the above description of the manufacture process for circuit 300. One may just as easily build circuit 200 by replacing layers 2 and 3 shown in FIG. 6 and layers 5, 6, and 7 shown in FIG. 10 with layers 2 and 3 shown in FIG. 5 and layers 5, 6 and 7 shown in FIG. 19, respectively, and altering the manufacturing process in an obvious manner (for example, drilling a different number of holes and using different masks).

Additionally, while there have been shown and described and pointed out fundamental novel features of the invention as applied to embodiments thereof, it will be understood that various omissions and substitutions and changes in the form and details of the invention, as herein disclosed, may be made by those skilled in the art without departing from the spirit of the invention. It is expressly intended that all combinations of those elements and/or method steps which perform substantially the same function in substantially the same way to achieve the same results are within the scope of the invention. It is the intention, therefore, to be limited only as indicated by the scope of the claims appended hereto.

What is claimed is:

1. A mixer comprising a homogeneous structure of a plurality of layers of polytetrafluoroethylene composite and having at least one substantially rectangular coaxial balun, wherein said at least one substantially rectangular coaxial balun comprises:

at least three conducting surfaces, comprising a first conductive surface, a second conductive surface, and a third conductive surface, disposed on at least a subset of said plurality of layers, wherein said second conductive surface is between said first conductive surface and said third conductive surface; and at least two via hole structures connecting said first conductive surface and said third conductive surface, wherein said at least two via hole structures do not intersect said second conductive surface.

2. The mixer of claim 1 wherein said conductive surface is copper.

3. The mixer of claim 1 wherein said mixer has a center frequency of operation between approximately 0.9 GHz and approximately 6 GHz.

4. The mixer of claim 1 wherein said mixer has a frequency of operation from approximately 0.1 GHz to approximately 10 GHz.

5. The mixer of claim 1 wherein:

three non-adjacent layers of said plurality of layers have a relative dielectric constant of approximately 3; and wherein four of said plurality of layers have a relative dielectric constant of approximately 6.15.

6. The mixer of claim 1 wherein:

three non-adjacent layers of said plurality of layers have a thickness greater than approximately 0.020 inches; and wherein four of said plurality of layers have a thickness less than approximately 0.010 inches.

7. The mixer of claim 1 wherein said at least three conductive surfaces have a thickness of from approximately 0.0005 inches to approximately 0.0025 inches.

8. The mixer of claim 1 wherein said via hole structures are plated via holes.

9. A method of manufacturing a mixer comprising the steps of:

manufacturing a plurality of layers of polytetrafluoroethylene composite;

etching at least three conducting surfaces, comprising a first conductive surface, a second conductive surface, and a third conductive surface, disposed on at least a subset of said plurality of layers, wherein said second conductive surface is between said first conductive surface and said third conductive surface; and connecting said first conductive surface and said third conductive surface with at least two via hole structures to form at least one substantially rectangular coaxial balun, wherein said at least two via hole structures do not intersect said second conductive surface.

10. The method of manufacturing a mixer of claim 9 wherein said at least three conductive surfaces are copper lines.

11. The method of manufacturing a mixer of claim 9 wherein said mixer had a center frequency of operation between approximately 0.9 GHz and approximately 6 GHz.

12. The method of manufacturing a mixer of claim 9 wherein said mixer has a frequency of operation from approximately 0.1 GHz to approximately 10 GHz.

13. The method of manufacturing a mixer of claim 9 wherein:

three non-adjacent layers of said plurality of layers have a relative dielectric constant of approximately 3; and four of said plurality of layers have a relative dielectric constant of approximately 6.15.

14. The method of manufacturing a mixer of claim 9 wherein:

three non-adjacent layers of said plurality of layers have a thickness greater than approximately 0.020 inches; and four of said plurality of layers have a thickness less than approximately 0.010 inches.

15. The method of manufacturing a mixer of claim 9 wherein said at least three conductive surfaces have a thickness of from approximately 0.0005 inches to approximately 0.0025 inches.

16. The method of manufacturing a mixer of claim 9 wherein said via hole structures are plated via holes.

17. A mixer comprising a homogeneous structure of a plurality of layers of polytetrafluoroethylene composite and having at least one substantially rectangular coaxial balun, wherein said at least one substantially rectangular coaxial balun comprises:

metal line means for forming a plurality of horizontal walls and at least one center conductor; and via hole means for forming a plurality of vertical walls connecting said plurality of horizontal walls, wherein said via hole means does not intersect said at least one center conductor.

18. The mixer of claim 17 wherein said metal line means is copper line means.

19. The mixer of claim 17 wherein said mixer has a center frequency of operation between approximately 0.9 GHz and approximately 6 GHz.

20. The mixer of claim 17 wherein said mixer has a frequency of operation from approximately 0.1 GHz to approximately 10 GHz.

21. The mixer of claim 17 wherein three non-adjacent layers of said plurality of layers have a relative dielectric constant of approximately 3; and wherein four of said plurality of layers have a relative dielectric constant of approximately 6.15.

22. The mixer of claim 17 wherein three non-adjacent layers of said plurality of layers have a thickness greater than approximately 0.020 inches; and wherein four of said plurality of layers have a thickness less than approximately 0.010 inches.

23. The mixer of claim 17 wherein said via hole means is plated via hole means.

* * * * *